United States Patent
Pyper et al.

(10) Patent No.: US 12,040,262 B2
(45) Date of Patent: Jul. 16, 2024

(54) FLEX BOARD AND FLEXIBLE MODULE

(71) Applicant: Apple Inc., Cupertino, CA (US)

(72) Inventors: Dennis R. Pyper, San Jose, CA (US);
Leilei Zhang, Sunnyvale, CA (US);
Lan H. Hoang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 93 days.

(21) Appl. No.: 17/381,931

(22) Filed: Jul. 21, 2021

(65) Prior Publication Data

US 2023/0026254 A1    Jan. 26, 2023

(51) Int. Cl.
| | |
|---|---|
| *H01L 23/498* | (2006.01) |
| *H01L 21/48* | (2006.01) |
| *H01L 23/58* | (2006.01) |
| H01L 21/56 | (2006.01) |
| H01L 23/00 | (2006.01) |
| H01L 23/31 | (2006.01) |
| H01L 25/10 | (2006.01) |

(52) U.S. Cl.
CPC ...... *H01L 23/49822* (2013.01); *H01L 21/481* (2013.01); *H01L 21/4857* (2013.01); *H01L 23/49894* (2013.01); *H01L 23/58* (2013.01); *H01L 21/561* (2013.01); *H01L 23/3121* (2013.01); *H01L 23/4985* (2013.01); *H01L 24/16* (2013.01); *H01L 25/105* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 6,590,292 B1 * | 7/2003 | Barber | H01L 21/563 |
| | | | 257/E23.101 |
| 9,379,044 B2 * | 6/2016 | Lim | H01L 21/76865 |
| 10,622,320 B2 * | 4/2020 | Kim | H01L 23/5283 |
| 11,011,844 B2 | 5/2021 | Im | |
| 2004/0195700 A1 * | 10/2004 | Liu | H01L 25/0655 |
| | | | 257/E23.125 |
| 2020/0395675 A1 | 12/2020 | Han et al. | |
| 2022/0068904 A1 * | 3/2022 | Park | H01L 25/18 |
| 2022/0157680 A1 | 5/2022 | Shanmugam et al. | |

FOREIGN PATENT DOCUMENTS

JP    2011222788 A  * 11/2011  ......... C08G 73/1042

* cited by examiner

*Primary Examiner* — Hung K Vu
(74) *Attorney, Agent, or Firm* — Aikin & Gallant, LLP

(57) ABSTRACT

Flexible modules and methods of manufacture are described. In an embodiment, a flexible module includes a flex board formed in which a passivation layer is applied in liquid form in a panel level process, followed by exposure and development. An electronic component is then mounted onto the flex board and encapsulated in a molding compound that is directly on a top surface of the passivation layer.

16 Claims, 10 Drawing Sheets

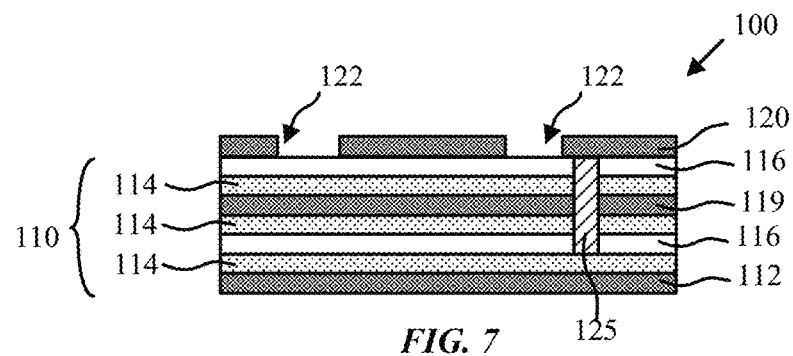
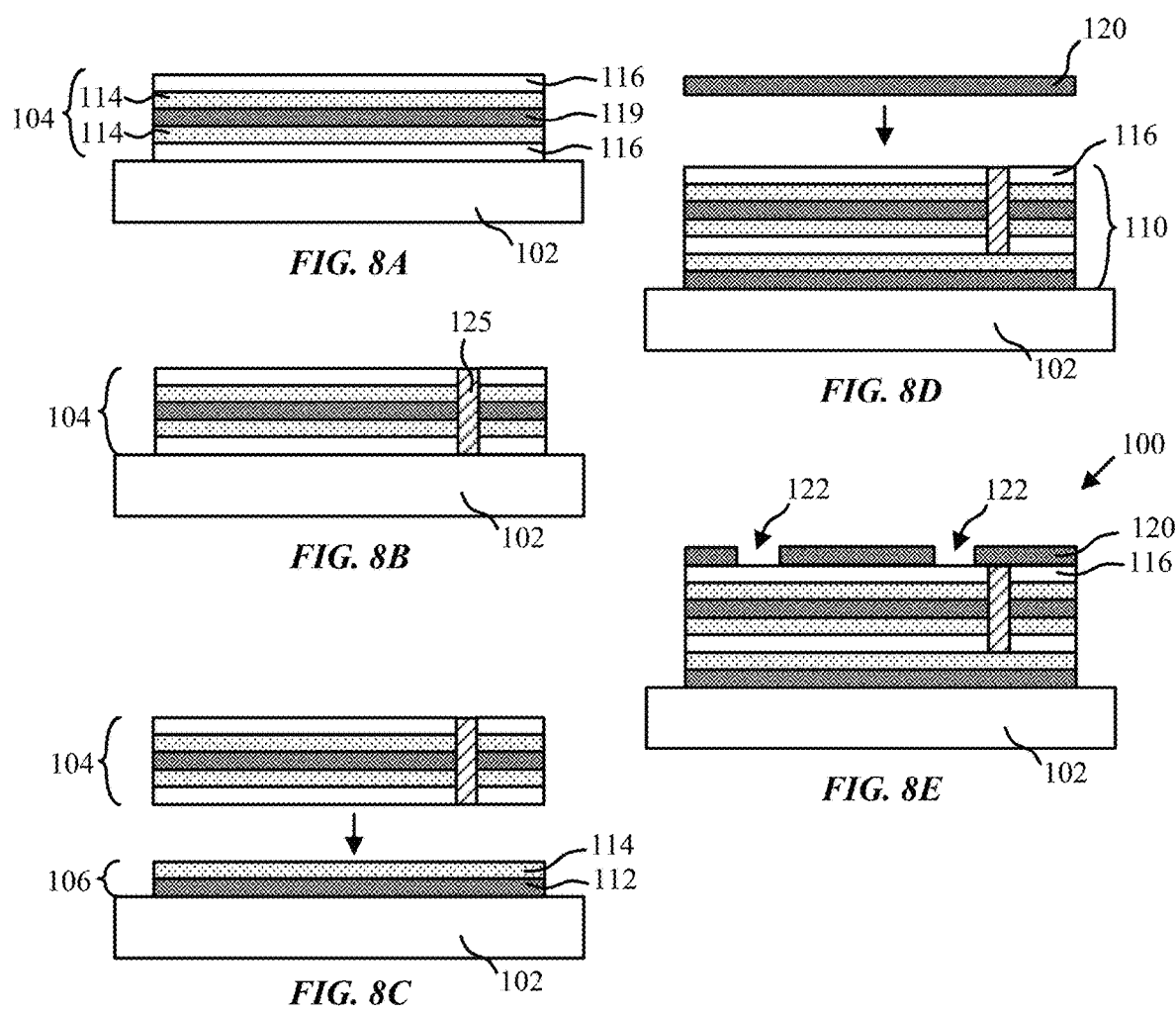

FLEX BOARD AND FLEXIBLE MODULE

BACKGROUND

Field

Embodiments described herein relate to electronic packaging, and more particularly to flexible modules.

Background Information

The current market demand for portable and mobile electronic devices such as mobile phones, personal digital assistants (PDAs), digital cameras, portable players, gaming, wearables, and other mobile devices requires the integration of more performance and features into increasingly smaller spaces where available module substrate area may be restricted.

Flexible printed circuit boards (PCB), also referred to as flex boards or flexible printed circuits, are becoming more common, where unlike traditional rigid PCBs, the flexible PCBs can be bent, folded or twisted during use or to meet design objectives. Such flex boards commonly include a flexible substrate (e.g. polymer such as polyimide, polyester, polyethylene naphthalate, etc.) with laminated circuit pattern (e.g. metal foil pattern such as copper) on one or both sides of the flexible substrate. Multiple layer flex boards can include multiple layers of laminated metal foil layers including metal routing layers, as well as top and bottom side passivation (e.g. polyimide). This may be accomplished by laminating together one or more single sided flexible copper clad laminates (FCCL) that may include a flexible cover layer, commonly referred to as a coverlay (e.g. polyimide), adhesive layer (such as epoxy or acrylic) and copper film over a panel substrate (e.g. glass). This may be accompanied by laser drilling and plating processes to form via openings and filled micro-vias between stacked metal layers. A plurality of flex boards is commonly cut, or punched out, from a single panel substrate.

SUMMARY

In an embodiment, a flexible module includes a flex board formed of one or more metal layers, a bottom side passivation layer, and a top passivation layer. In an embodiment, the top passivation layer is formed of a cured polymer, such as polyimide, and an electronic component is solder bonded to a first area of the flex board. A molding compound may encapsulate the electronic component, be formed directly on a top surface of the top passivation layer and cover the first area of the flex board. The top passivation layer may include a photo radical generator, which facilitates a method of fabrication which utilizes deposition of a liquid, photoimageable passivation layer.

In an embodiment, a method of forming a flexible module includes depositing a liquid passivation layer onto a multiple layer flex circuit stack, and exposing and developing the liquid passivation layer into a cured passivation layer including an opening that exposes an underlying metal layer of the multiple layer flex circuit stack. An electronic component can then be mounted over the cured passivation layer, followed by encapsulating the electronic component in a molding compound directly on a top surface of the cured passivation layer.

BRIEF DESCRIPTION OF THE DRAWINGS

FIG. 7 is a cross-sectional side view illustration of a flex board with a laminated multiple layer flex circuit stack and single sided photoimageable passivation layer in accordance with an embodiment.

FIGS. 8A-8E are cross-sectional side view illustrations of a method of fabricating the flex board of FIG. 7 in an embodiment.

DETAILED DESCRIPTION

Figure 1:
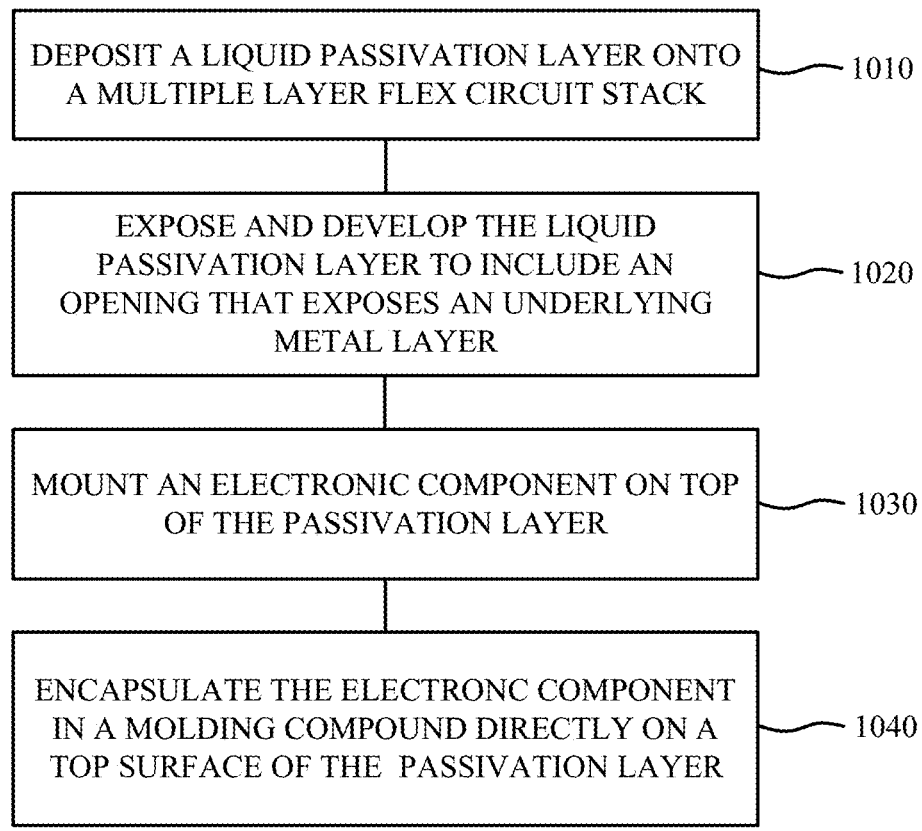
FIG. 1 is a flow diagram for a method of forming a flexible module including a flex board in accordance with an embodiment.

Embodiments describe flexible modules and method of manufacture. In an embodiment, a flexible module includes a flex board including one or more metal layers, a bottom side passivation layer and a top passivation layer. The top passivation layer may be formed of a cured polymer, and more specifically may include a photo radical generator for photoimaging. In accordance with embodiments an electronic component can be solder bonded to a first area of the flex board, and then be encapsulated in a molding compound that is formed directly on a top surface of the top passivation layer and covers a first area of the flex board.

In one aspect, embodiments describe flexible modules and manners of manufacture in which a liquid photoimageable passivation layer (e.g. polyimide) is used to form the outermost passivation layer, or coverlay, of a flex board. The liquid photoimageable passivation layer can then be exposed and developed to form one or more openings that expose an underlying metal layer for subsequent mounting of components (e.g. chips). It has been observed that upon curing, such a passivation layer may facilitate better adhesion with molding compound compared to traditional laminated coverlays (e.g. polyimide) within flexible copper clad laminates (FCCL). Thus, this allows for component (chip) mounting followed by molding directly onto the flex board, potentially eliminating separate chip or component packaging prior to joining with the flex board.

In another aspect, embodiments are not limited use of photoimageable polymers for the outermost passivation layers. The liquid photoimageable polymer may also be used to form the interior dielectric layers of a flex board. In this manner, lithographic techniques can be utilized to obtain finer feature patterning. Thin film deposition and growth techniques can be used to achieve thinner dielectric layers and metal layers than with traditional laminated flex boards, which can result in an overall thinner flex board and reduced form factor.

In another aspect, embodiments integrate photoimageable polymers into a panel level (or roll-to-roll) processing sequence. While photoimageable polymers may be more commonly integrated into redistribution layers in wafer level processing, the traditional spin coating application technique for wafer level processing is not directly applicable to panel level or roll-to-roll processing. Instead, lamination techniques are well established and adopted for the formation of passivation layers, or coverlays, for flex board panel level processing. In accordance with embodiments, the outermost passivation layers can be applied in liquid form using a suitable technique such as slot die coating, silk screen printing, etc. Furthermore, the passivation layers can optionally be selectively applied, reducing material waste. Additionally, embodiments may increase production units per hour (UPH) by integrating photo imaging of the passivation layers to simultaneously form openings exposing the underlying metal layers, which can be performed at higher throughput than traditional laser drilling processes where comparable openings are created one-by-one.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "top", "bottom", "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers. Reference to a "top" passivation layer and "bottom" side passivation layer herein with regard to a flex board is meant to refer to relative position with respect to other layers of a flex board than a particular orientation of the flex board.

Figure 2:
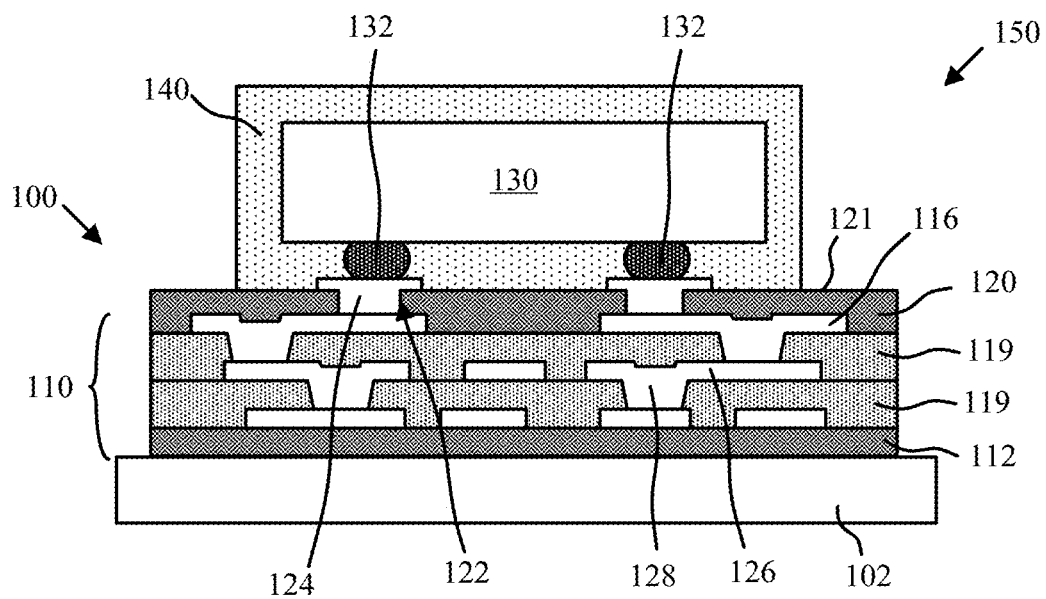
FIG. 2 is a cross-sectional side view illustration of a flexible module including a flex board in accordance with an embodiment.
Figure 3A:
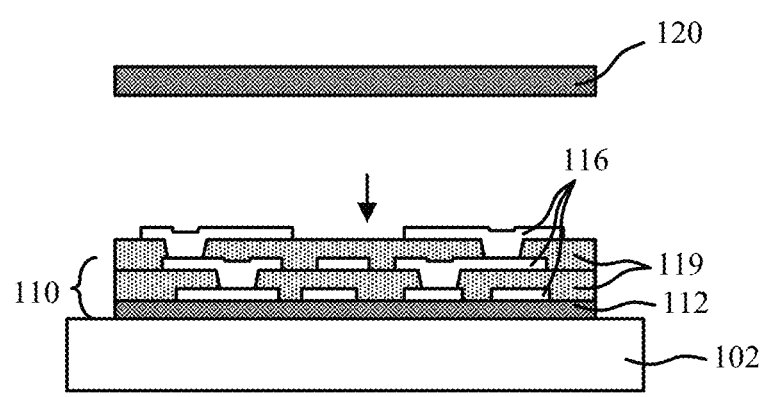
FIGS. 3A-3B are cross-sectional side view illustrations of a method of fabricating the flex board of FIG. 2 in an embodiment.
Figure 3B:
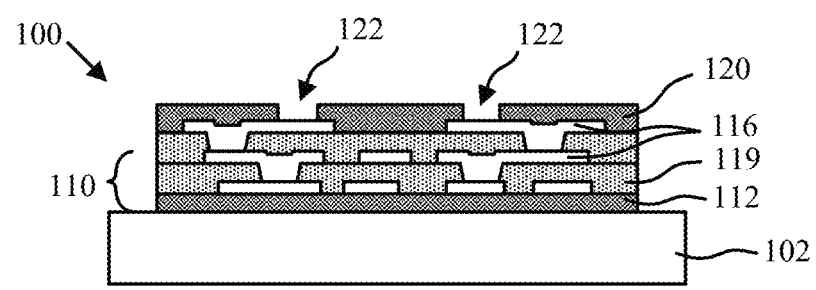

Referring now to FIGS. 1-3B, FIG. 1 is a flow diagram of a method of forming a flexible module including a flex board in accordance with an embodiment; FIG. 2 is a cross-sectional side view illustration of a flexible module including a flex board in accordance with an embodiment; FIGS. 3A-3B are cross-sectional side view illustrations of a method of fabricating the flex board 100 of FIG. 2 in an embodiment. In interest of clarity and conciseness the description of method of FIG. 1 is made with regard to the flexible module of FIGS. 2 and 3A-3B. It is to be appreciated that the embodiment of FIG. 2 is exemplary, and the method of forming a flexible module can be integrated with a variety of flex board structures, and module implementations.

As shown in FIG. 3A, in the illustrated process sequence a multiple layer flex circuit stack 110 is formed on a panel substrate 102. The exemplary multiple layer flex circuit stack 110 illustrated includes bottom side passivation layer 112, multiple metal layers 116, and multiple internal passivation layers 119 (dielectric layers).

At operation 1010 a liquid passivation layer 120 is deposited onto the multiple layer flex circuit stack 110. Suitable deposition techniques can include slot die coating, silk screen printing, etc. The liquid passivation layer 120 can be globally deposited or selectively deposited. For example, the liquid passivation layer 120 can be globally deposited over the multiple layer flex circuit stack 110 across a panel substrate 102, or selectively deposited over the multiple layer flex circuit stack 110 across several select areas over a panel substrate 102 that will correspond to separate flex substrates that are subsequently stamped, or cut, out. It is to be appreciated however that use of an underlying panel substrate 102, such as rigid or flexible glass, metal, etc. substrate is optional however, and the multiple layer flex circuit stack 110 may possess sufficient robustness for panel level roll to roll processing, for example, without a supporting panel substrate 102.

The multiple layer flex circuit stack 110 in accordance with embodiments may have been pre-assembled at this manufacturing stage using various techniques such as thin film processing or lamination. In either configuration, the multiple layer flex circuit stack 110 can include one or more metal layers 116, one or more internal passivation layers 119 (dielectric layers), and a bottom side passivation layer 112. The metal layers may be patterned to form conductive traces 126. Where thin film growth techniques are used, the metal layers may also include vias 128 formed with the conductive traces 126. Where lamination techniques are used, laser drilled via openings are formed between metal layer and filled with metal to form vias.

At operation 1020 the (photoimageable) liquid passivation layer 120 is exposed (e.g. to ultraviolet light) and developed (e.g. wet chemical exposure) to include one or more openings 122 that expose an underlying metal layer 116, which may be pre-patterned, as shown in FIG. 3B. For example, openings 122 may expose wiring paths, landing pads, etc. of the underlying metal layer 116. This may optionally be followed by formation of under bump metallurgy (UBM) pads 124 within the openings and on the underlying metal layer. Alternatively, the passivation layer 120 is patterned to form openings 122 exposing UBM pads 124, or underlying metal layer.

One or more electronic components 130 can then be mounted onto the exposed underlying metal layer 116 at operation 1030 using a suitable technique such as flip chip bonding using solder bumps 132, for example. Electronic components can be a variety of components 130 including chips, diodes, micro-electromechanical system (MEMS) devices, passive devices (e.g. resistors, capacitors, inductors, etc.), as well as packages. In some embodiments, the electronic components are unmolded.

The one or more electronic components 130, either individually, collectively, or as groups, can then be encapsulated at operation 1040 into one or more corresponding molding compound groups (same process, different molding cavities) where the molding compound 140 is formed directly on a top surface 121 of the passivation layer 120. The exposure and development sequence in prior operation 1020 in accordance with embodiments may result in a cured passivation layer 120. For example, a photoimageable polyimide passivation layer 120 may have different surface properties than a traditional laminated polyimide passivation layer (coverlay), facilitating greater adhesion of the molding compound 140 to the passivation layer 120 compared to laminated coverlays.

In accordance with embodiments, a plurality of flexible modules 150 can then be punched out or cut from the panel substrate 102 after encapsulation. Alternatively, a plurality of flex boards 100 can be punched out or cut, followed by component mounting and encapsulation to form the flexible modules 150. The multiple layer flex circuit stacks 110 in accordance with embodiments may have been formed at panel level using a variety of manners including thin film techniques and lamination. Additionally, the flex boards 100 in accordance with embodiments may be single sided (e.g. include UBM pads 124 on a single side) or double sided (e.g. include UBM pads 124 on both top and bottom sides).

Figure 4:
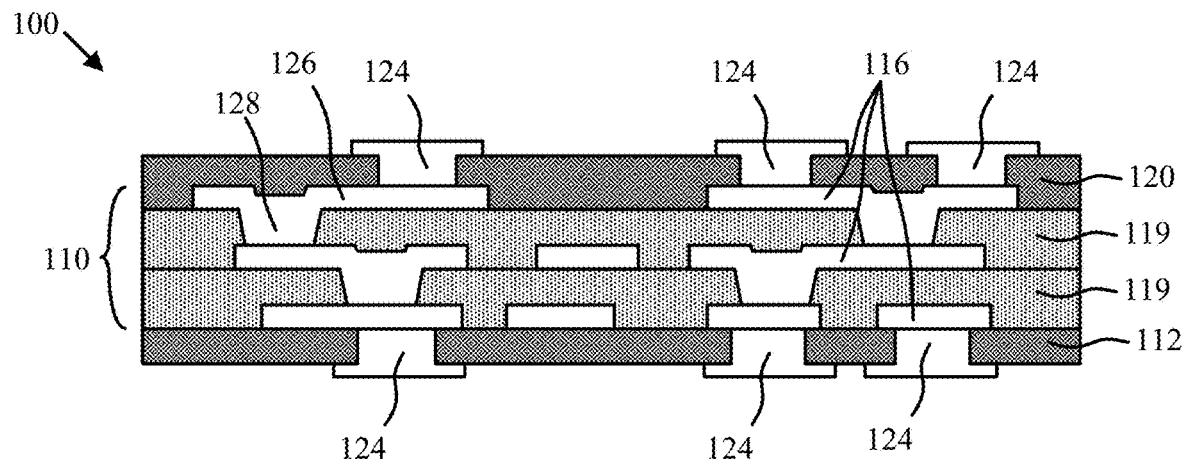
FIG. 4 is a schematic cross-sectional side view illustration of a flex board with thin film multiple layer flex circuit stack in accordance with an embodiment.

FIG. 4 is a schematic cross-sectional side view illustration of a flex board 100 with a thin film multiple layer flex circuit stack 110 in accordance with an embodiment. In the particular embodiment illustrated, the passivation layers can be patterned with lithography. Metal layers 116, including conductive traces 126 and vias 128 may be created by first depositing a seed layer, followed by growing a bulk metal (e.g., copper) pattern. Alternatively, metal layers 116 including conductive traces 126 and vias 128 may be formed by deposition (e.g., sputtering) and etching. The conductive trace 126 and connected vias 128 may be formed with a single bulk metal layer. The material of conductive traces 126 and vias 128 can include, but is not limited to, a metallic material such as copper, titanium, nickel, gold, and combinations or alloys thereof. The metal pattern is then embedded in an internal passivation layer 119, which is optionally patterned. The internal passivation layers 119 in accordance with embodiments using thin film processes may be any suitable photoimageable material such as an oxide, or polymer (e.g., polyimide).

In accordance with embodiments, a thin film flex board 100 may have a thickness that is less than a conventional organic or laminate flex board. For example, a conventional six metal layer organic or laminate flex board may have a thickness of 200 µm-500 µm. Thickness of a thin film flex board 100 in accordance with embodiments may be determined by the number of metal layers 116 and passivation layers as well as the manner for formation. In accordance with embodiments, the conductive traces of the metal layers 116 may have a thickness 10 µm or less, such as approximately 3-10 µm, or more specifically 5 µm or less, such as approximately 3-5 µm. In accordance with embodiments, the passivation layers (dielectric layers) have a thickness of 5 µm or less, such as 2-5 µm. The thin film flex boards 100 in accordance with embodiments may additionally allow for narrower line spacing width (fine pitch) and thinner lines compared to conventional organic or laminate flex boards. In an embodiment, the thin film flex board 100 has total a maximum thickness of less than 70 µm, or more specifically approximately 50 µm or less, such as approximately 30 µm. In an exemplary implementation, a bi-layer for a metal layer 116 and corresponding internal passivation layer 119 can be approximately 5 µm for a thin film flex board 100. Presuming a variation of up to an additional 30 µm for layer thickness variation, or additional passivation layers, a thin film flex board 100 may be less than 50 µm for a 4 metal layer design, or less than 70 µm for an 8 metal layer design. In accordance with embodiments, thicknesses of the top side passivation layer 120 and bottom side passivation layer 112 can be adjusted to provide requisite strength for the flex board 100, and may be thicker than the internal passivation layers 119, and may be formed of the same material.

Figure 5:
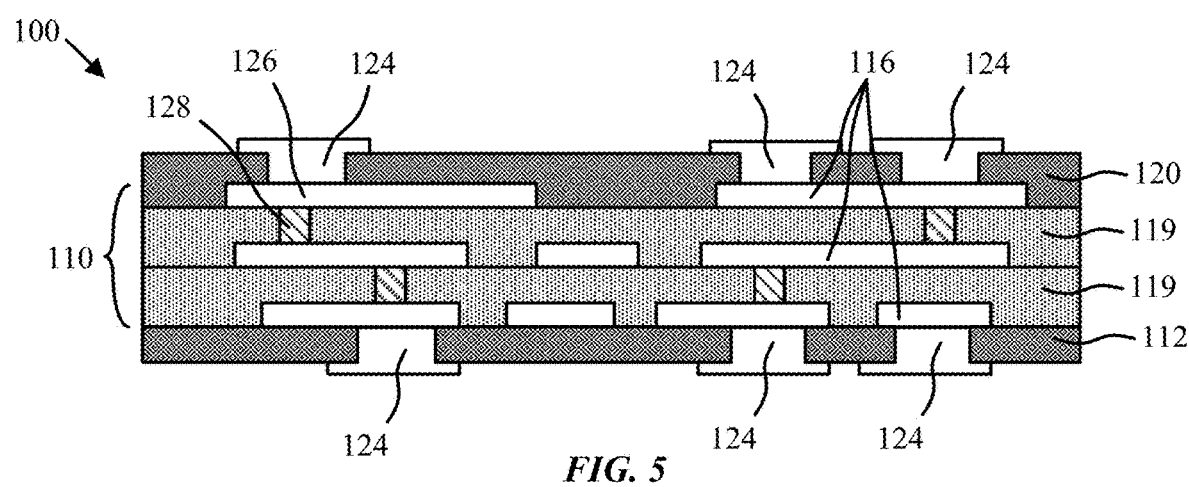
FIG. 5 is a schematic cross-sectional side view illustration of a flex board with laminated multiple layer flex circuit stack in accordance with an embodiment.

FIG. 5 is a schematic cross-sectional side view illustration of a flex board with laminated multiple layer flex circuit stack in accordance with an embodiment. In an embodiment, the multiple layer flex circuit stack 110 may be a conventional flex circuit stack including one or more single or double sided flexible copper clad laminates (FCCL) that may include a flexible bottom side passivation layer 112, commonly referred to as a cover layer or coverlay (e.g. polyimide) metal layer 116 (e.g. copper film), and an adhesive layer (such as epoxy or acrylic) to hold the metal layer 116 on the bottom side passivation layer 112. In addition, internal passivation layers 119 and metal layers 116 may be include, also with intermediate adhesive layers between the internal passivation layers and metal layers 116. The multiple layer flex circuit stack 110 may additionally include one or more via openings and filled micro-vias between stacked metal layers 116 (e.g. copper film). The metal layers 116 may additionally be pre-patterned prior to lamination, or patterned (e.g. laser, chemical etch, etc.) during the lamination sequence to form various wiring patterns.

In an embodiment, a flexible module 150 includes a flex board 100 formed of one or more metal layers 116 (e.g. patterned copper film), a bottom side passivation layer 112 and a top passivation layer 120 formed of a cured polymer, such as polyimide. An electronic component 130, such as a silicon chip, etc. may be bonded to a first area of the flex board 100, and a molding compound 140 encapsulates the electronic component 130. Specifically, the molding compound 140 may be formed directly on a top surface 121 of the top passivation layer 120 and cover the first area of the flex board.

The top passivation layer 120 in accordance with embodiment can be formed of a photoimageable material applied in liquid form, then exposed and developed. Thus, the top passivation layer 120 can include a photo radical generator component, which would not commonly be found in a laminated coverlay material. In some embodiments, both the top passivation layer 120 and bottom side passivation layer 112 include a same monomer, such as imide for a polyimide composition. Where only the top passivation layer 120 is applied in liquid form, then the bottom side passivation layer 112 may not include the photo radical generator. In other embodiments, both the top passivation layer 120 and the bottom side passivation layer 112 are applied in liquid form, and both may include a photo radical generator, which can be the same. Thus, top and/or bottom side connections can be made by patterning and developing the top and/or bottom side passivation layers to form openings 122 to expose one or more underlying metal layers 116. In an embodiment, UBM pads 124 are formed on the underlying metal layer within the openings. One or more electronic components can then be solder bonded to flex board 100 (e.g. to the UBM pads or directly to the underlying metal layer) using a suitable technique such as flip chip bonding.

The liquid photoimageable top passivation layer 120, bottom side passivation layer 112 and/or internal passivation layer(s) 119 can be applied to a variety of multiple layer flex circuit stacks 110 in accordance with embodiments to form a variety of flex boards 100 for integration into a variety of flexible modules 150. In an embodiment, the internal passivation layer 119 and top passivation layer both include a same monomer and same photo radical generator. In an embodiment, one or more meal layers incudes a first metal layer 116 including a conductive trace 126 and a via 128 within the internal passivation layer 119. For example, the conductive trace may have a thickness of 5 um or less; and the internal passivation layer (and hence via 128) has a thickness of 5 um or less. In an embodiment, the first metal layer 116 is formed of a seed layer and copper bulk layer on top of the seed layer.

Figure 6A:
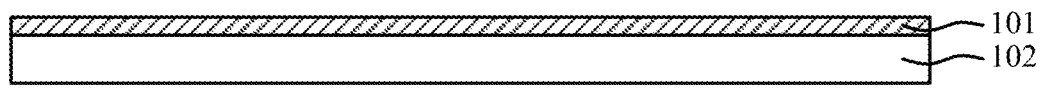
FIGS. 6A-6J are schematic cross-sectional side view illustrations of a method of forming a flex board with thin film multiple layer flex circuit stack in accordance with an embodiment.
Figure 6B:
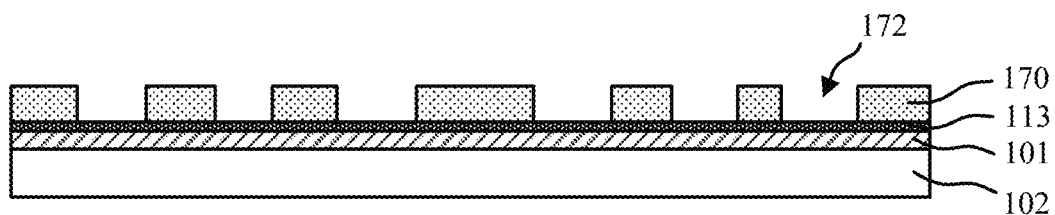
Figure 6C:
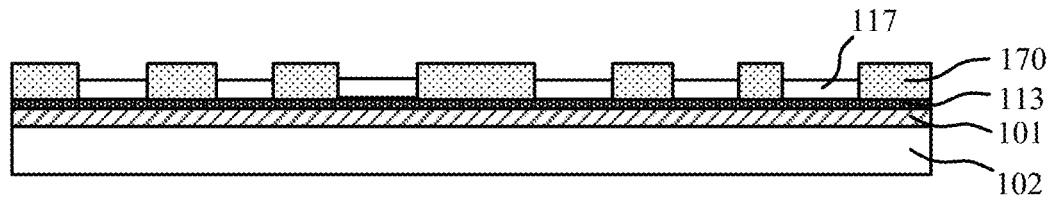
Figure 6D:
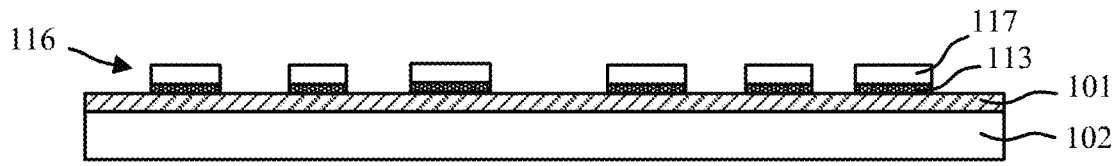

FIGS. 6A-6J are schematic cross-sectional side view illustrations of a method of forming a flex board with thin film multiple layer flex circuit stack in accordance with an embodiment. As shown in FIG. 6A the sequence may begin with a panel substrate 102 and release layer coating 101 over the panel substrate 102 so that the overlying layers to be formed can be released, or peeled form the panel substrate 102. A seed layer 113 can then be deposited over the panel substrate 102 using a suitable technique such as sputtering, evaporation, chemical vapor deposition, etc. This is followed by deposition of a photoresist layer 170 coating, followed by exposure and developing to form openings 172 in the photoresist layer 170 as shown in FIG. 6B. Bulk metal layer 117 may then be plated on the exposed seed layer 113 and within the openings 172 as shown in FIG. 6C, followed by stripping of the photoresist layer 170 and exposed seed layer 113 that is not underneath the bulk metal layer 117 as shown in FIG. 6D. Together the patterned bulk metal layer 117 and seed layer 113 form the patterned metal layer 116, including any contact pads and conductive traces.

Figure 6E:
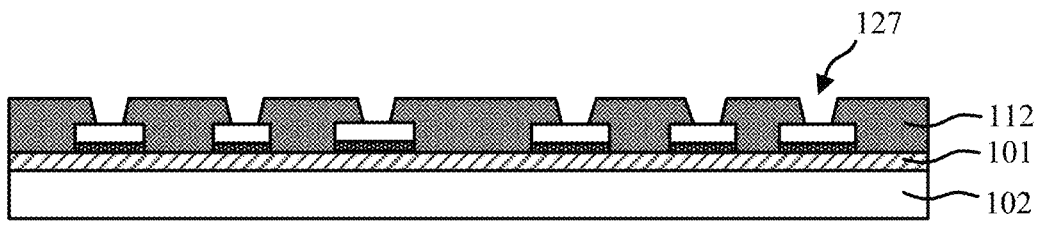
Figure 6F:
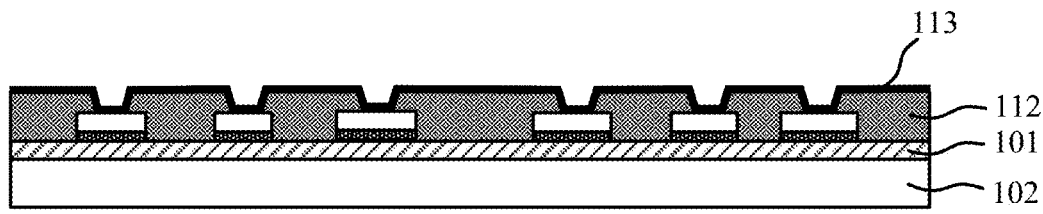
Figure 6G:
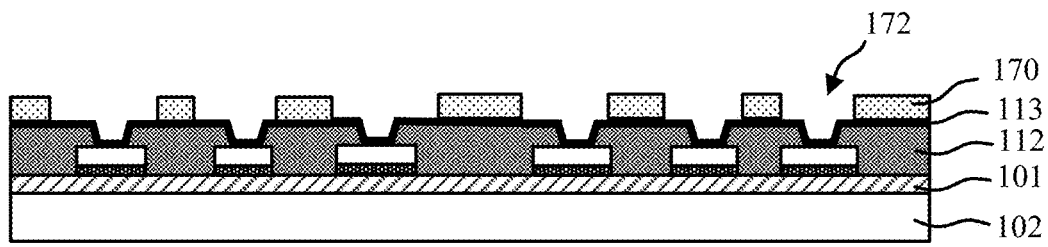
Figure 6H:
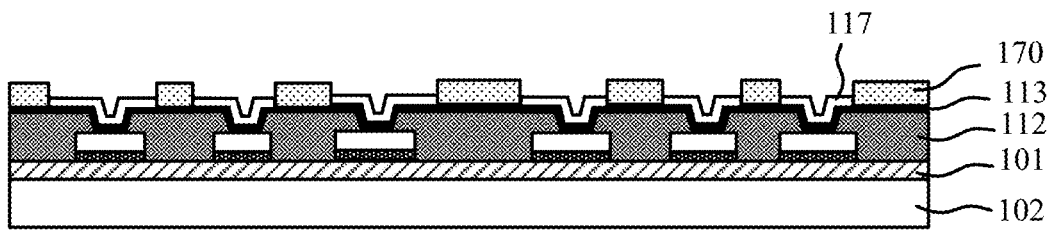
Figure 6I:
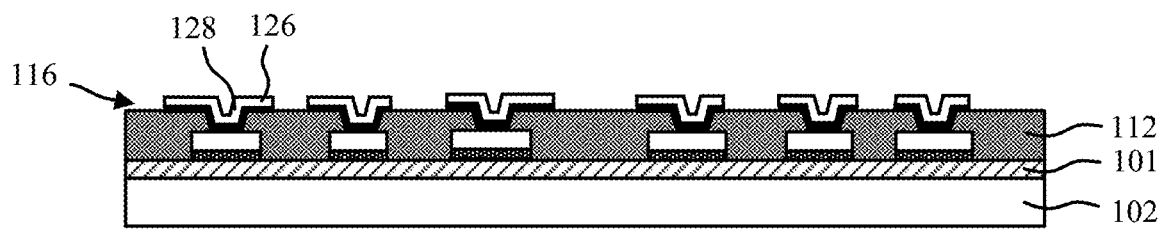

Referring now to FIG. 6E a bottom side passivation layer 112 may then be formed over the patterned metal layer 116 and patterned to form openings 127 exposing the patterned metal layer. In an embodiment, the bottom side passivation layer 112 is a photoimageable polymer deposited in liquid form, exposed and developed as previously described.

Figure 6J:
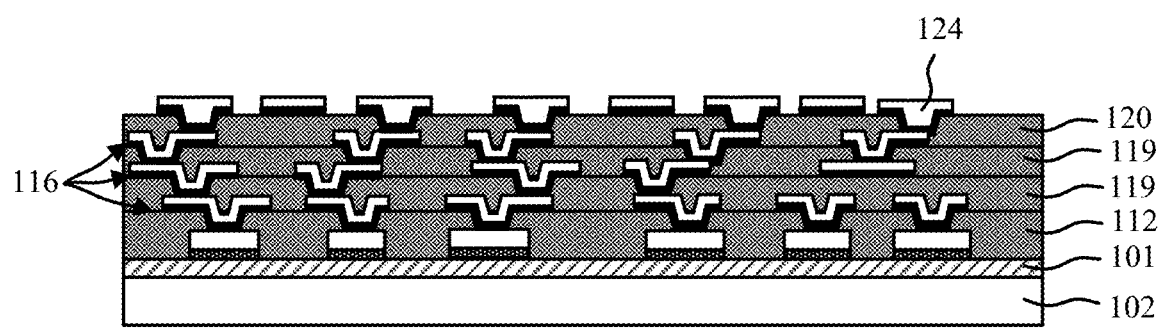

The sequence of FIGS. 6B-6D may then be repeated to form the next metal layer 116 as shown in FIGS. 6F-6I including any contact pads, conductive (metal) traces 126 and vias 128. This can be followed by deposition of an additional liquid photoimageable polymer passivation layers 119 and metal layers 116 to obtain requisite number of metal layers and thickness of the flex board 100. As previously described, this may be followed by deposition, exposure and developing of a top passivation layer 120 and formation of UBM pads 124 as shown in FIG. 6J. For a single sided flex board 100, the stackup of FIG. 6J can be removed, followed by optional formation of a bottom side passivation layer, and optional patterning of the bottom side passivation layer and optional formation of UBM pads 124 on the bottom side.

Referring now to FIGS. 7 and 8A-8D, FIG. 7 is a cross-sectional side view illustration of a flex board 100 with multiple metal layers 116 and single sided photoimageable passivation layer (top passivation layer 120) in accordance with an embodiment. FIGS. 8A-8D are cross-sectional side view illustrations of a method of fabricating the flex board 100 of FIG. 7 in an embodiment. The flex board 100 of FIG. 7 differs from FIG. 2 with the addition of multiple metal layers 116, and one or more micro-vias 125 connected between metal layers 116.

The process sequence may begin with applying (or laminating) a double sided FCCL 104 onto a panel substrate 102 as shown in FIG. 8A. For example, this may be aided by an underlying adhesive layer (not illustrated). As shown, the double sided FCCL 104 can include a plurality of metal layers 116, adhesive layers 114, and one or more internal passivation layers 119 (e.g. polyimide). A via opening can then be laser drilled into the double sided FCCL 104 to connect two or more metal layers 116, followed by plating of one or more metal layers to completely fill, or coat sidewalls of the via openings to form micro-vias 125.

In the particular embodiment illustrated in FIG. 8C, the doubled sided FCCL 104 stack including the optional micro-vias 125 can be laminated onto a coverlay stack 106 including a bottom side passivation layer 112 and adhesive layer 114. A liquid photoimageable top passivation layer 120 can then be applied to the metal layer 116 as shown in FIG. 8D using a suitable technique such as slot die coating, silk screen printing, etc. The (photoimageable) liquid passivation layer 120 is exposed (e.g. to ultraviolet light) and developed (e.g. wet chemical exposure) to include one or more openings 122 that expose an underlying metal layer 116 as shown in FIG. 8E.

Figure 9:
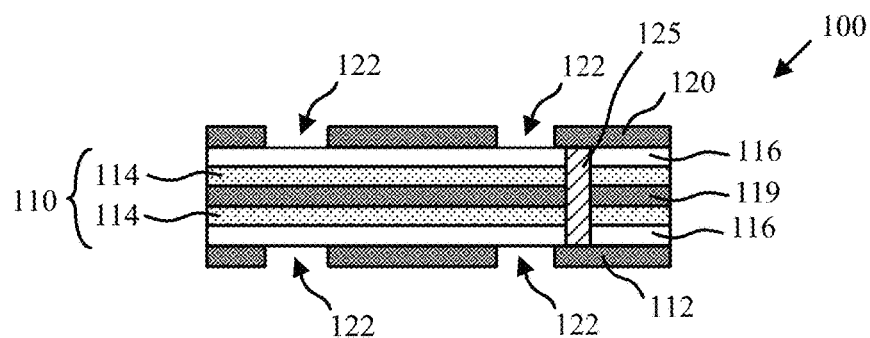
FIG. 9 is a cross-sectional side view illustration of a flex board with a laminated multiple layer flex circuit stack and double sided photoimageable passivation layers in accordance with an embodiment.
Figure 10A:
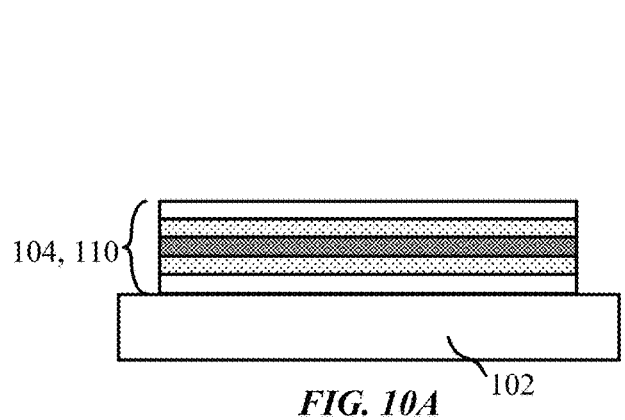
FIGS. 10A-10D are cross-sectional side view illustrations of a method of fabricating the flex board of FIG. 9 in an embodiment.
Figure 10C:
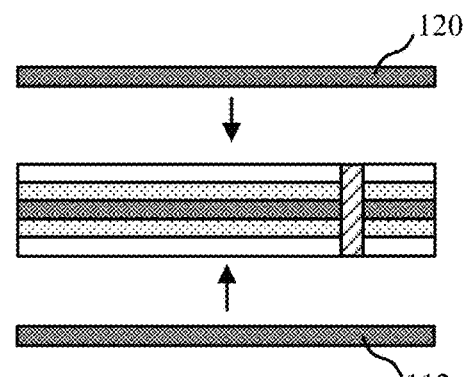
Figure 10B:
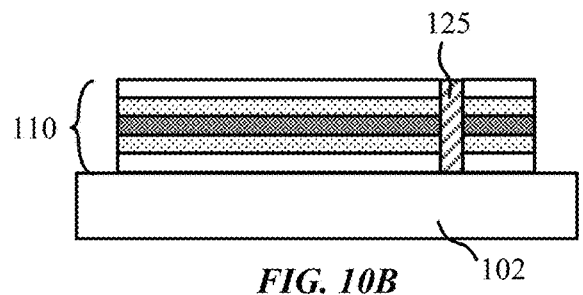
Figure 10D:
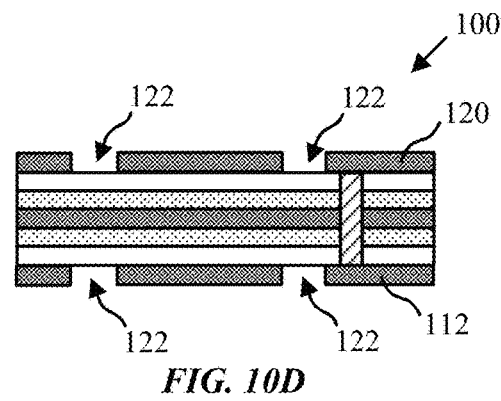

While FIGS. 7-8E illustrate flex boards with single sided liquid photoimageable passivation layers embodiments are not so limited and the liquid photoimageable passivation layers can be applied to either or both sides of the multiple layer flex circuit stacks 110. FIG. 9 is a cross-sectional side view illustration of a flex board 100 with multiple metal layers 116 and double sided photoimageable passivation layers in accordance with an embodiment. FIGS. 10A-10D are cross-sectional side view illustrations of a method of fabricating the flex board of FIG. 9 in an embodiment. The fabrication sequence of FIGS. 10A-10B can proceed similarly as that previously described and illustrated in FIGS. 8A-8B. Referring now to FIG. 10C, in the illustrated embodiment the top passivation layer 120 and bottom side passivation layer 112 can be simultaneously or sequentially applied in liquid form. For example, the passivation layers can be simultaneously applied in a roll-to-roll processing sequence. Alternatively, the liquid passivation layers can be sequentially applied using a series of panel substrate 102, and flipping. In either sequence, the top side passivation layer 120 and the bottom side passivation layer 112 can be exposed (e.g. to ultraviolet light) and developed (e.g. wet chemical exposure) to include one or more openings 122 that expose an underlying metal layer 116 as shown in FIG. 10D.

Figure 11:
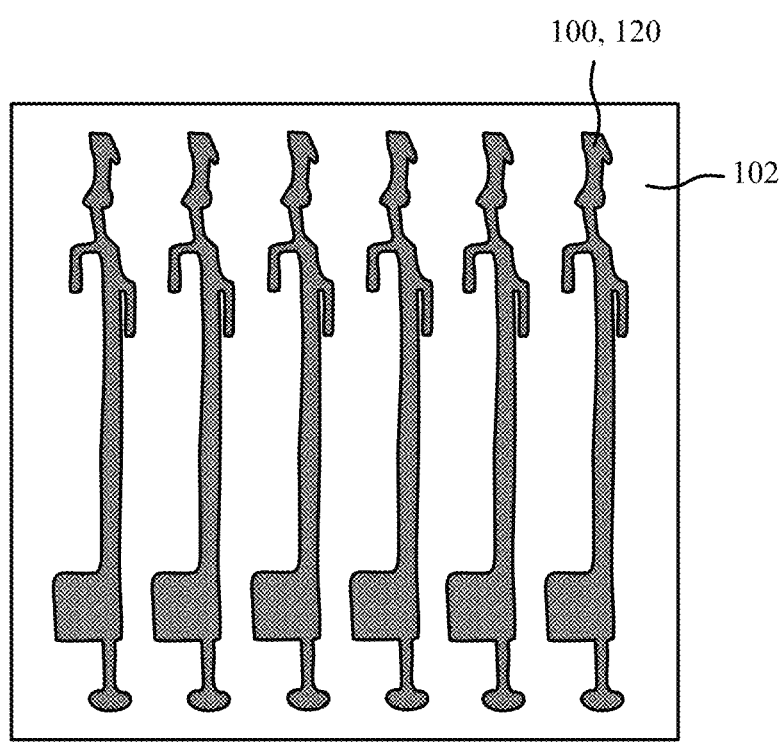
FIG. 11 is a schematic top view illustration of a plurality of flex board patterns on a panel substrate in accordance with an embodiment.

Referring now to FIG. 11, a schematic top view illustration is provided of a plurality of flex board 100 patterns on a panel substrate 102 in accordance with an embodiment. As can be seen, the plurality of flex board patterns can be cut from or punched out from a single panel substrate 102. In some embodiments, the plurality of layers are globally formed across the panel substrate 102, including the exemplary top passivation layer 120. In some embodiments the top passivation layer 120 can also be selectively applied to only the flex board 100 areas. In such a fabrication sequence material cost may be reduced.

Figure 12:
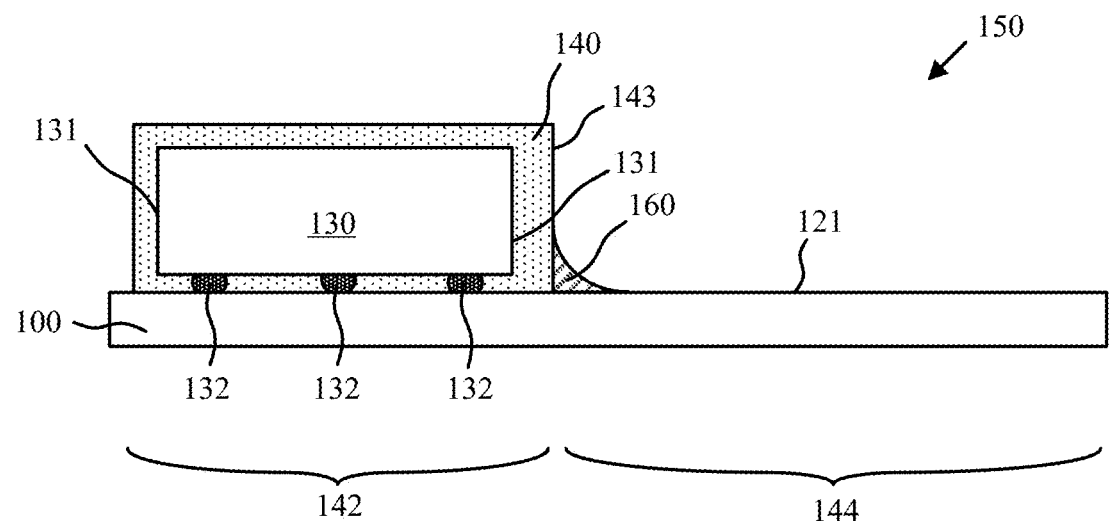
FIG. 12 is a schematic cross-sectional side view illustration of a flexible module in accordance with an embodiment.
Figure 13:
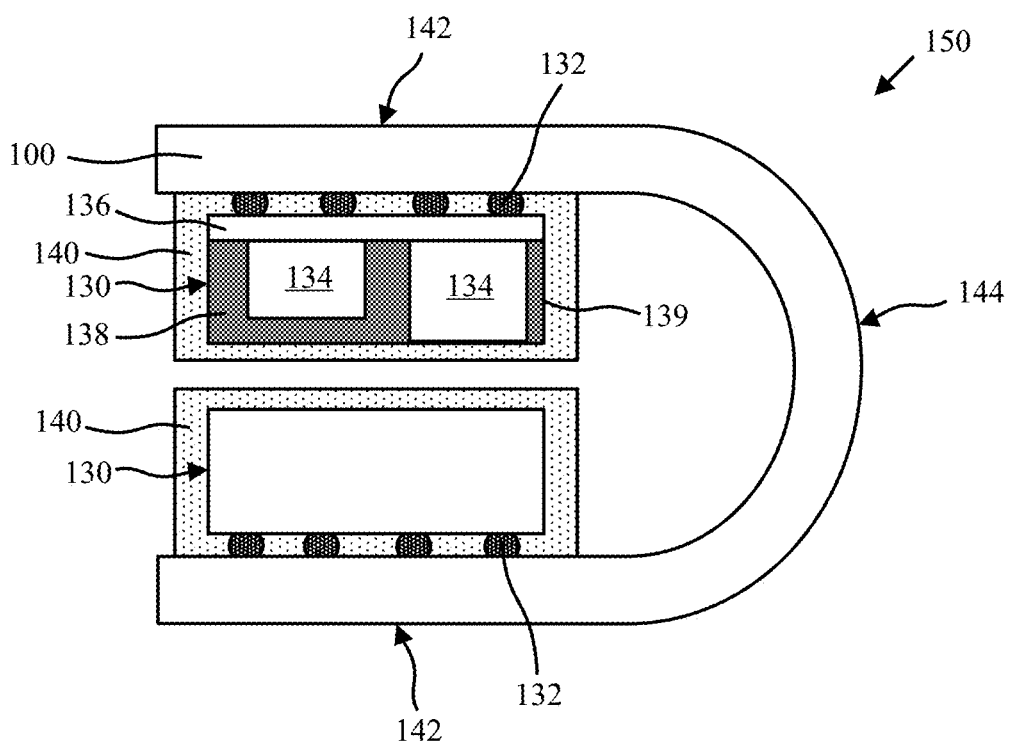
FIG. 13 is a schematic cross-sectional side view illustration of a flexible module in accordance with an embodiment.

The various flex boards 100 in accordance with embodiments can be further processed to form flexible modules in accordance with embodiments. For example, one or more electronic components 130 can be mounted on the flex boards 100 before or after cutting or punching out from the panel substrate 102, when present. FIGS. 12-13 are schematic cross-sectional side view illustrations of flexible module 150 in accordance with an embodiment. In particular, FIG. 12 illustrates a flexible module 150 including a flex tail in accordance with an embodiment, and FIG. 13 illustrates a folded, or bent, flexible module 150 including different types of electronic components 130. It is to be appreciated that FIGS. 12-13 are not mutually exclusive and various structural features separately illustrated and described can be combined. Furthermore, the particular embodiments illustrated in FIGS. 12-13 can implement any of the various flex boards 100 described herein.

Referring now to FIG. 12 a flexible module 150 is illustrated similar to that previously illustrated and described with regard to FIG. 2. In each embodiment, the molding compound 140 may be formed directly on a top surface 121 of the top passivation layer 120. In an embodiment, the molding compound 140 is formed directly on a top surface 121 of the top passivation layer 120 and covers the first area 142 of the flex board 100. Where the electronic component 130 is a chip, and the molding compound 140 may be in direct contact with sidewalls 131 of the chip. Furthermore, a second area 144 of the flex board 100 extends laterally from the first area 142, with the second area not covered by the molding compound, or any molding compound. In some configurations, the electronic component 130 and the molding compound 140 render the first area of the flex board 100 as rigid, and the second area 144 remains flexible (e.g. flex tail). A polymeric side fill material 160 can additionally be formed adjacent a lateral edge 143 of the molding compound 140 facing the flexible second area 144 of the flex board 100. For example, the polymeric side fill material 160 can be a thermoset such as epoxy. Such a configuration may provide physical robustness and strain relief to the molded electronic component 130 where the second area 144 (flex tail) is bent, folded, twisted, or otherwise distorted.

Additional possible module integration characteristics are illustrated in FIG. 13, where multiple electronic components 130 are illustrated as being bonded to the flex board 100, which is also bent, or folded. As shown, on a bottom side an electronic component 130 can be solder bonded onto the flex board 100 and encapsulated in a molding compound 140 as previously described. The top side however illustrates that electronic components 130 can also be pre-molded package structures. For example, such electronic components 130 may include one or more chips 134 encapsulated in an interior molding compound 138 (package-level molding compound) on a package-level routing layer 136. Upon mounting (solder bonding) the electronic component 130 (package) onto the flex board 100, the package can be encapsulated in a molding compound 140 that laterally surrounds an interior molding compound 138 of the molded package. Where the electronic component 130 is a package, the molding compound may be in direct contact with sidewalls 139 of the interior molding compound 138.

Figure 14:
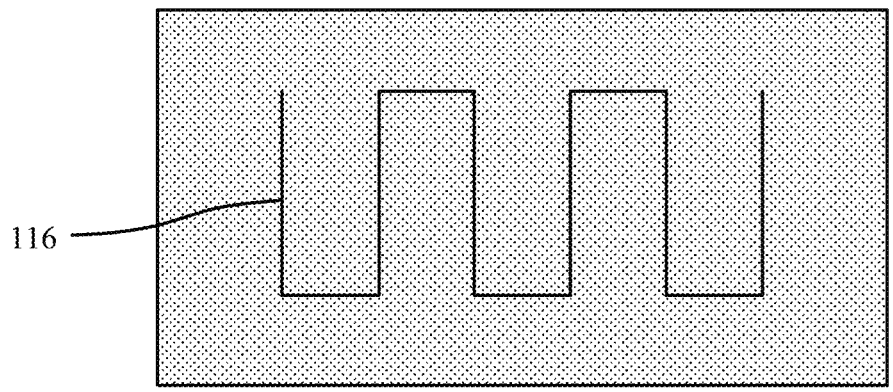
FIG. 14 is a schematic top view illustration of a resistor formed within a metal layer of a flex board in accordance with an embodiment.
Figure 15:
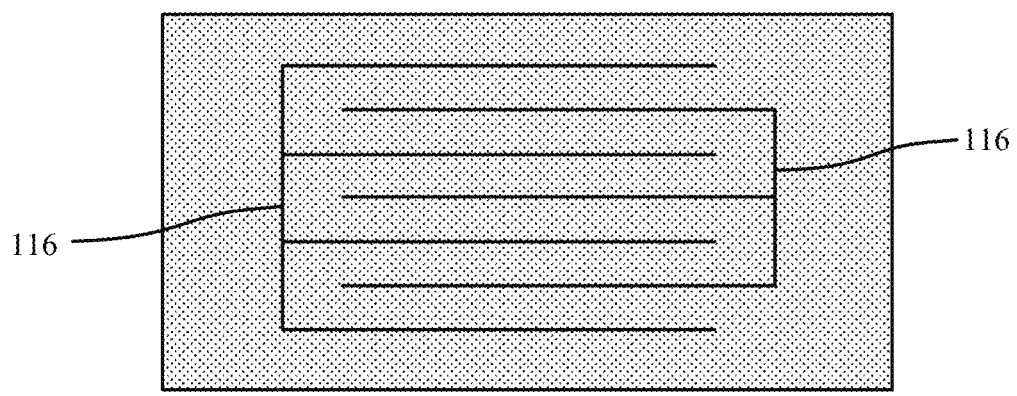
FIG. 15 is a schematic top view illustration of a finger capacitor formed within a metal layer of a flex board in accordance with an embodiment.
Figure 16:
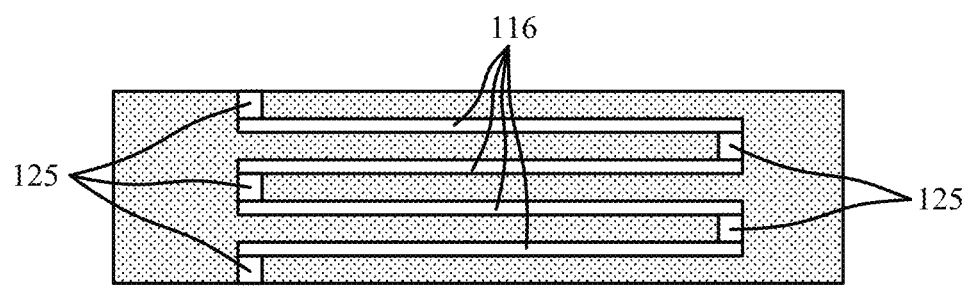
FIG. 16 is a schematic cross-sectional side view illustration of an inductor formed within multiple metal layers of a flex board in accordance with an embodiment.

The flex boards 100 in accordance with embodiments may optionally include additional embedded devices within the multiple layer stack-ups. Such devices may be passive devices such as resistors, capacitors, inductors, etc. These may be included in the pre-patterned metal layers, or patterned during the lamination sequence. FIG. 14 is a schematic top view illustration of a resistor formed within a metal layer 116 of a flex board in accordance with an embodiment. As shown, a resistor can be formed using a zig-zag pattern within a single metal layer 116, for example. In accordance with embodiments, the metal layers 116 forming the resistor can be formed with fine line width and spacing, for example, L/S of 3/3 µm or less. FIG. 15 is a schematic top view illustration of a finger capacitor formed within a metal layer 116 of a flex board in accordance with an embodiment. As shown, the (finger) capacitor can be formed by patterning a metal layer 116 to include separate interdigitated finger structures within the metal layer 116 encapsulated within an internal passivation layer of 6 µm thickness or less. FIG. 16 is a schematic cross-sectional side view illustration of an inductor formed within multiple metal layers 116 of a flex board separated by an internal passivation layer of 6 µm thickness or less in accordance with an embodiment. As shown, the multiple metal layers 116 may be connected with micro-vias 125 to form the inductor structure between a bottom side and top side of the flex board in the exemplary embodiment illustrated. Referring briefly back to FIGS. 2, 12 and 13 for example, the thin film flex boards 100 in accordance with embodiments can also allow for UBM pad 124 connection pitches with mounted components of 100 µm or less. In an embodiment, a component 130 with silicon thickness of 10 µm or less is mounted on a flex board 100 with UBM pad 124 pitch of 100 µm or less.

In utilizing the various aspects of the embodiments, it would become apparent to one skilled in the art that combinations or variations of the above embodiments are possible for forming a flex board and module. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A flexible module comprising:
   a flex board including one or more metal layers, a bottom side passivation layer, and a top passivation layer;
   wherein the top passivation layer is formed of a cured polymer and comprises a photo radical generator;
   an electronic component solder bonded to a first area of the flex board; and
   a molding compound encapsulating the electronic component, wherein the molding compound is formed directly on a top surface of the top passivation layer and covers the first area of the flex board;
   a flexible second area of the flex board that extends from the first area, the flexible second area not covered by the molding compound, wherein the first area is rendered rigid by the molding compound and the flexible second area is bent relative to the first area.

2. The flexible module of claim 1, wherein the top passivation layer comprises polyimide.

3. The flexible module of claim 1, wherein the top passivation layer and the bottom side passivation layer comprise a same monomer.

4. The flexible module of claim 3, wherein the top passivation layer and the bottom side passivation layer comprise polyimide.

5. The flexible module of claim 3, wherein the bottom side passivation layer does not include the photo radical generator.

6. The flexible module of claim 1, wherein the flex board includes an internal passivation layer, the top passivation layer and the internal passivation layer comprise a same monomer and the same photo radical generator.

7. The flexible module of claim 6, wherein:
the one or more metal layers includes a first metal layer including a conductive trace and a via within the internal passivation layer;
the conductive trace has a thickness of 5 um or less; and
the internal passivation layer has a thickness of 5 um or less.

8. The flexible module of claim 7, wherein the first metal layer is formed of a seed layer, and copper bulk layer on top of the seed layer.

9. The flexible module of claim 7, wherein the electronic component is bonded to a group of under bump metallurgy (UBM) pads of the flex board with a pitch of 100 μm or less.

10. The flexible module of claim 7, wherein the flex board includes a passive device within the one or more metal layers, the passive device selected from the group consisting of a resistor, a capacitor, and an inductor.

11. The flexible module of claim 1, further comprising a polymeric side fill material adjacent a lateral edge of the molding compound facing the flexible second area of the flex board, wherein the polymeric side fill material is substantially located along the lateral edge of the molding compound facing the flexible second area of the flex board and the polymeric side fill material does not extend underneath the molding compound.

12. The flexible module of claim 11, wherein the polymeric side fill material is a thermoset.

13. The flexible module of claim 1, wherein the electronic component is a chip, and the molding compound is in direct contact with sidewalls of the chip.

14. The flexible module of claim 1, wherein the electronic component is a molded package, and the molding compound laterally surrounds an interior molding compound of the molded package.

15. The flexible module of claim 1, wherein the flex board includes a plurality of metal layers and a plurality of adhesive layers, and a micro-via connected between at least two metal layers of the plurality of metal layers.

16. The flexible module of claim 1, wherein the flex board includes a passive device within the one or more metal layers, the passive device selected from the group consisting of a resistor, a capacitor, and an inductor.

* * * * *